US010713156B2

(12) United States Patent
Walker et al.

(10) Patent No.: US 10,713,156 B2
(45) Date of Patent: Jul. 14, 2020

(54) SYSTEMS AND METHODS FOR MEMORY SYSTEM MANAGEMENT

(71) Applicant: Micron Technology, Inc., Boise, ID (US)

(72) Inventors: Robert Walker, Raleigh, NC (US); David A. Roberts, Santa Cruz, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/126,405

(22) Filed: Sep. 10, 2018

(65) Prior Publication Data

US 2019/0121723 A1 Apr. 25, 2019

Related U.S. Application Data

(63) Continuation of application No. 14/247,833, filed on Apr. 8, 2014, now Pat. No. 10,089,221, which is a
(Continued)

(51) Int. Cl.
*G06F 1/20* (2006.01)
*G06F 12/02* (2006.01)
(Continued)

(52) U.S. Cl.
CPC .......... *G06F 12/0223* (2013.01); *G06F 1/206* (2013.01); *G06F 1/3275* (2013.01);
(Continued)

(58) Field of Classification Search
None
See application file for complete search history.

(56) References Cited

U.S. PATENT DOCUMENTS 5,142,302 A 8/1992 Kano
6,199,139 B1* 3/2001 Katayama ............ G06F 1/3203
711/106
(Continued)

FOREIGN PATENT DOCUMENTS

CN 101504628 A 8/2009
CN 105122226 A 12/2015
(Continued)

OTHER PUBLICATIONS

"Chinese Application Serial No. 20140021823.0, Preliminary Amendment filed Mar. 23, 2016", W/ English Claims, 32 pgs.
(Continued)

*Primary Examiner* — Michael Sun
(74) *Attorney, Agent, or Firm* — Schwegman Lundberg & Woessner, P.A.

(57) ABSTRACT

Methods of mapping memory regions to processes based on thermal data of memory regions are described. In some embodiments, a memory controller may receive a memory allocation request. The memory allocation request may include a logical memory address. The method may further include mapping the logical memory address to an address in a memory region of the memory system based on thermal data for memory regions of the memory system. Additional methods and systems are also described.

18 Claims, 13 Drawing Sheets

Related U.S. Application Data continuation of application No. 14/055,672, filed on Oct. 16, 2013, now Pat. No. 9,342,443.

(60) Provisional application No. 61/791,673, filed on Mar. 15, 2013.

(51) Int. Cl.

| | | |
|---|---|---|
| *G06F 3/06* | (2006.01) | |
| *G11C 7/04* | (2006.01) | |
| *G06F 1/3234* | (2019.01) | |
| *G06F 12/122* | (2016.01) | |
| *G06F 13/24* | (2006.01) | |
| *G06F 13/16* | (2006.01) | |
| *G06F 13/42* | (2006.01) | |
| *G11C 11/406* | (2006.01) | |

(52) U.S. Cl.
CPC .......... *G06F 3/0604* (2013.01); *G06F 3/0631* (2013.01); *G06F 3/0673* (2013.01); *G06F 12/023* (2013.01); *G06F 12/122* (2013.01); *G06F 13/1668* (2013.01); *G06F 13/24* (2013.01); *G06F 13/4282* (2013.01); *G11C 7/04* (2013.01); *G06F 2212/1016* (2013.01); *G11C 11/40626* (2013.01); *Y02D 10/13* (2018.01); *Y02D 10/14* (2018.01); *Y02D 10/151* (2018.01); *Y02D 10/16* (2018.01)

(56) References Cited

U.S. PATENT DOCUMENTS

| | | | |
|---|---|---|---|
| 7,705,721 | B1 | 4/2010 | Chen et al. |
| 9,342,443 | B2 | 5/2016 | Walker et al. |
| 9,508,607 | B2* | 11/2016 | Chua-Eoan ............ H01L 23/34 |
| 9,767,012 | B2 | 9/2017 | Walker et al. |
| 2005/0216222 | A1 | 9/2005 | Inoue |
| 2006/0028880 | A1 | 2/2006 | Mikami et al. |
| 2006/0161373 | A1 | 7/2006 | Mangrulkar et al. |
| 2007/0005996 | A1 | 1/2007 | Nalawadi et al. |
| 2007/0106860 | A1 | 5/2007 | Foster, Sr. et al. |
| 2007/0219747 | A1 | 9/2007 | Hughes et al. |
| 2008/0007319 | A1 | 1/2008 | Cox |
| 2008/0052483 | A1 | 2/2008 | Rangarajan et al. |
| 2008/0103634 | A1 | 5/2008 | Santos et al. |
| 2008/0170947 | A1* | 7/2008 | Sutardja ................. G06F 1/206 |
| | | | 417/32 |
| 2009/0077328 | A1 | 3/2009 | Arakawa et al. |
| 2009/0138220 | A1 | 5/2009 | Bell et al. |
| 2010/0037073 | A1 | 2/2010 | Huizenga et al. |
| 2011/0056225 | A1 | 3/2011 | Campbell |
| 2011/0093132 | A1 | 4/2011 | Tan et al. |
| 2011/0194369 | A1 | 8/2011 | Jeddeloh |
| 2011/0231697 | A1 | 9/2011 | Berke et al. |
| 2011/0252180 | A1 | 10/2011 | Hendry et al. |
| 2012/0072044 | A1* | 3/2012 | Slaby .................... G01K 13/00 |
| | | | 700/299 |
| 2012/0249219 | A1 | 10/2012 | Shoemaker |
| 2012/0271481 | A1* | 10/2012 | Anderson .............. G06F 1/206 |
| | | | 700/299 |
| 2012/0287692 | A1 | 11/2012 | Rotbard et al. |
| 2013/0003438 | A1 | 1/2013 | Merkel et al. |
| 2013/0013126 | A1* | 1/2013 | Salsbery ................ G06F 1/203 |
| | | | 700/299 |
| 2013/0067136 | A1 | 3/2013 | Bates et al. |
| 2013/0097609 | A1* | 4/2013 | Li ......................... G06F 1/203 |
| | | | 718/104 |
| 2013/0132972 | A1* | 5/2013 | Sur ......................... G06F 1/206 |
| | | | 718/105 |
| 2013/0275665 | A1* | 10/2013 | Saraswat ................. G11C 7/04 |
| | | | 711/106 |
| 2013/0289909 | A1 | 10/2013 | Lin |
| 2014/0013132 | A1 | 1/2014 | De Rochemont et al. |
| 2014/0140156 | A1* | 5/2014 | Shoemaker .............. G11C 7/04 |
| | | | 365/201 |
| 2014/0281311 | A1 | 9/2014 | Walker et al. |
| 2014/0304444 | A1 | 10/2014 | Walker et al. |
| 2016/0048347 | A1 | 2/2016 | Rangarajan et al. |
| 2016/0148905 | A1* | 5/2016 | Yu ....................... H01L 25/0657 |
| | | | 257/48 |
| 2016/0203854 | A1* | 7/2016 | Kim .................... H01L 25/0657 |
| | | | 365/222 |
| 2016/0259721 | A1 | 9/2016 | Walker et al. |
| 2017/0083065 | A1 | 3/2017 | Huang et al. |

FOREIGN PATENT DOCUMENTS

| | | |
|---|---|---|
| GB | 2494490 A | 3/2013 |
| JP | 2011154744 A | 8/2011 |
| JP | 2012185764 A | 9/2012 |
| JP | 2014531698 A | 11/2014 |
| KR | 100954733 B1 | 4/2010 |
| TW | 201506778 A | 2/2015 |
| WO | WO-2013048518 A1 | 4/2013 |
| WO | WO-2013095674 A1 | 6/2013 |
| WO | WO-2014149860 A1 | 9/2014 |

OTHER PUBLICATIONS

"Chinese Application Serial No. 201480021823.0, Office Action dated May 11, 2017", w/English Translation, 12 pgs.

"Chinese Application Serial No. 201480021823.0, Response filed Sep. 22, 2017 to Office Action dated May 11, 2017", w/English Claims, 26 pgs.

"European Application Serial No. 14770621.2, Extended European Search Report dated Aug. 8, 2016", 7 pgs.

"European Application Serial No. 14770621.2, Office Action dated Oct. 30, 2015", 2 pgs.

"European Application Serial No. 14770621.2, Response filed May 9, 2016 to Office Action dated Oct. 30, 2015", 4 pgs.

"International Application Serial No. PCT/US2014/021241, International Preliminary Report on Patentability dated Sep. 24, 2015", 14 pgs.

"International Application Serial No. PCT/US2014/021241, International Search Report dated Jul. 30, 2014", 4 pgs.

"International Application Serial No. PCT/US2014/021241, Written Opinion dated Jul. 30, 2014", 12 pgs.

"Japanese Application Serial No. 2016-500740, Office Action dated Oct. 18, 2016", w/English Translation, 18 pgs.

"Korean Application Serial No. 10-2015-7029481, Response filed Jun. 9, 2017 to Office Action dated May 12, 2017", w/ English Claims, 11 pgs.

"Korean Application Serial No. 1020157029481, Non Final Office Action dated Sep. 22, 2016", W/ English Translation, 10 pgs.

"Korean Application Serial No. 1020157029481, Office Action dated May 12, 2017", w/English Translation, 4 pgs.

"Taiwanese Application Serial No. 103109299, Office Action dated Apr. 12, 2017", w/English Translation, 14 pgs.

"Taiwanese Application Serial No. 103109299, Response filed May 3, 2017 to Office Action dated Apr. 12, 2017", w/English Translation, 3 pgs.

"European Application Serial No. 19192049.5, Extended European Search Report dated Nov. 25, 2019", 10 pgs.

\* cited by examiner

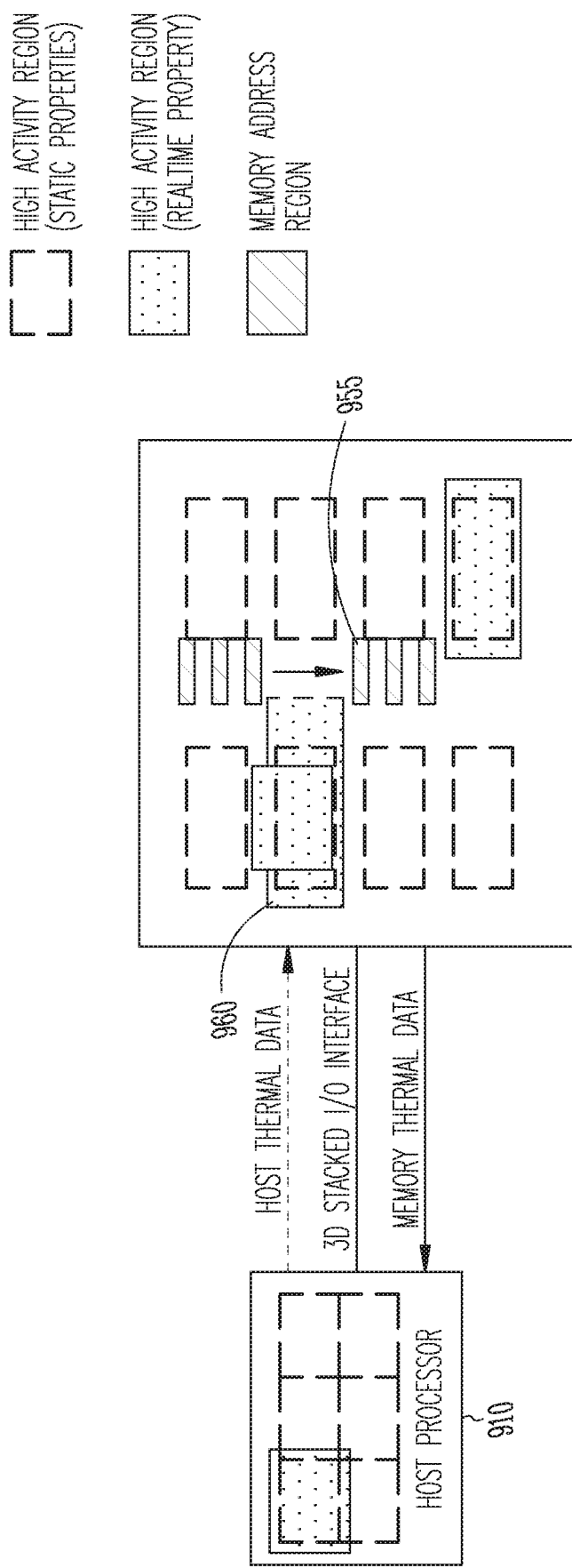

SYSTEMS AND METHODS FOR MEMORY SYSTEM MANAGEMENT

PRIORITY APPLICATION

This application is a continuation of U.S. application Ser. No. 14/247,833 filed Apr. 8, 2014, now issued as U.S. Pat. No. 10,089,221, which is a continuation of U.S. application Ser. No. 14/055,672, filed Oct. 16, 2013, and this application further claims the benefit of priority to U.S. Provisional Application No. 61/791,673, filed Mar. 15, 2013, both of which are incorporated herein by reference in its entirety.

BACKGROUND

Memory systems are used in many electronic devices such as personal digital assistants (PDAs), laptop computers, mobile phones and digital cameras. Recent memory chip designs, particularly those that use 3D-stacked structures, may exhibit increased data density and power density. With the use of multi-channel and sub-ranked memories, as well as partitioning of workloads across channels, it is possible for thermal hotspots to arise in the memory system.

Therefore, there exists a general need to perform thermal management, such as by energy management and resource sharing or workload fairness schemes to reduce or eliminate hotspots. There also exists a general need for request stream prioritization and transaction throttling mechanisms for energy management and resource sharing or workload fairness schemes.

BRIEF DESCRIPTION OF THE DRAWINGS

Some embodiments of the disclosed technology are illustrated by way of example and not limitation in the figures of the accompanying drawings in which:

FIGS. 9A-9B are diagrams of host- or memory controller-initiated data allocation using static and dynamic thermal data according to various embodiments;

DETAILED DESCRIPTION

Figure 1:
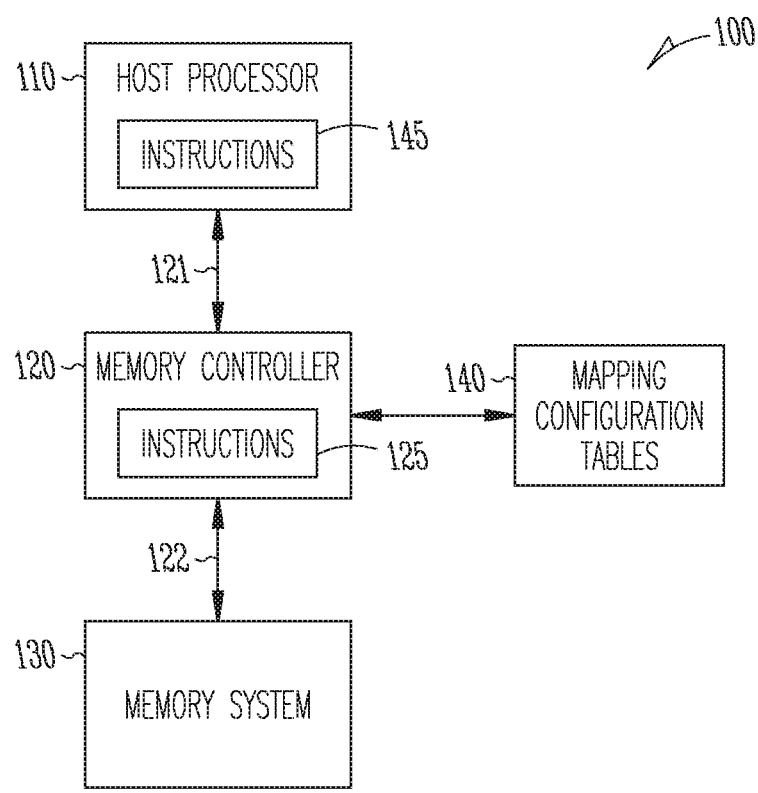
FIG. 1 is a diagram of a system according to various embodiments.

FIG. 1 is a diagram illustrating a system 100 in which example embodiments may be implemented. The system 100 may include a processor 110 coupled to a memory controller 120 through a first bus 121. The memory controller 120 may be coupled to a memory system 125 through a second bus 122. The memory controller 120 may execute memory transaction requests from the processor 110. The memory controller 120 may transfer data between the processor 110 and the memory system 125 over the first and second buses 121 and 122. The first bus 121 and the second bus 122 may employ a known protocol to connect the processor 110 to the memory controller 120 and to connect the memory controller 120 to the memory system 130. Some examples of system 100 may include personal computers, laptop computers, personal digital assistants (PDAs), digital cameras, electronic games, digital media player/records, and the like.

The memory system 130 may comprise one or more physical devices (not shown) each comprised of one or more physical channels (not shown) that are mapped to regions according to a data structure, hereinafter referred to by example as a "table", stored in a map RAM 140 of the memory controller 120. A region can be a channel, bank, vault, group, or any other grouping in a memory system. The map RAM 140 may store temperatures of regions of memory cells as described below with respect to FIG. 2. The memory controller 120 may include logic to map a logical memory address, received from the processor 110 in a memory allocation request, to a block address of a region based on the temperatures stored in the map RAM 140. The memory system 130 may include a hybrid memory cube (HMC) system of stacked memory dies though example embodiments are not limited thereto.

Instructions 145 may execute an operating system (OS) and one or more applications on the processor 110. The OS may request memory in the memory system 130 on behalf of the one or more applications. The memory controller 120 may map applications to physical locations in the memory system 130.

Current address mapping and memory configuration systems may be designed in view of performance or power requirements. These or other systems may not provide a mechanism by which a memory system 130 can influence the data allocation choices of host processors 110, inform host processors 110 of events such as thermal emergencies, or provide thermal profiles to other thermally-connected elements.

On-Die Sensors and Thermal Models

In some embodiments, the processor 110 or the memory controller 120 may use on-die thermal sensors and thermal models to direct how data is mapped and relocated. In some example embodiments, the processor 110 or the memory controller 120 may use on-die thermal sensors and thermal models to individually adjust memory cell refresh across regions based on their temperature.

Figure 2:
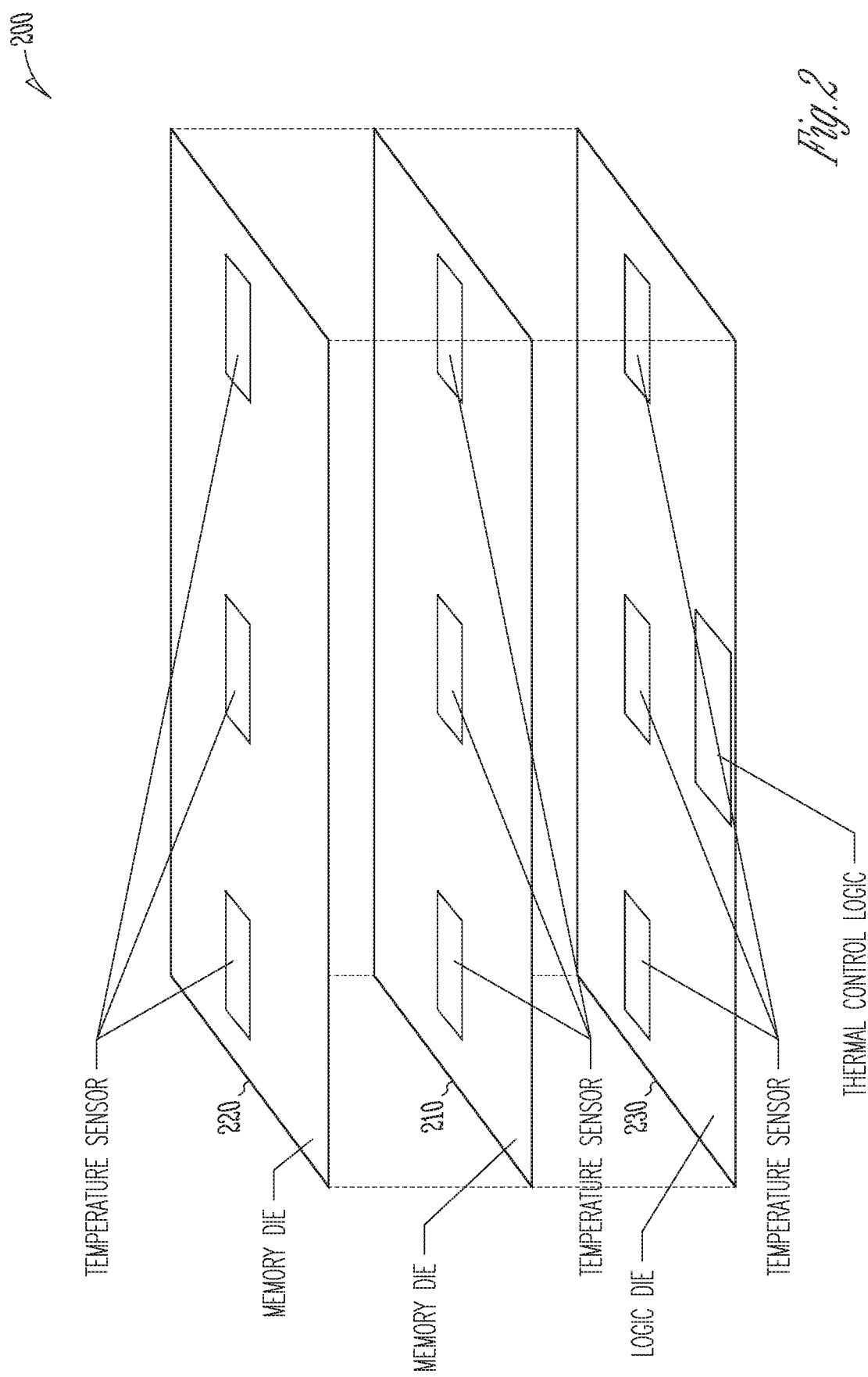
FIG. 2 is a diagram of a hybrid chip stack according to various embodiments.

FIG. 2 is a diagram of a memory system 200 according to various embodiments. The memory system 200 may serve functions of the memory system 130 (FIG. 1). The memory system 200 may comprise memory dies 210 and 220. While two memory dies are illustrated, the memory system 200 may include fewer or more than two memory dies. The memory dies 210 and 220 may include two or more regions of memory cells. Two or more of the plurality of regions of memory cells may each include a thermal sensor (TS) for sensing a temperature of a corresponding region of memory cells.

The memory system 200 may include independent logic and memory dies, dies stacked via silicon interposers or directly stacked dies ("3D stacking"), or any other arrangement of logic and storage dies. In example embodiments, thermal sensors (TS) may be included in the logic die 230, in one or more memory dies, or in both logic die 230 and memory dies 210 and 220. Each of the plurality of memory dies may include at least one TS. Each of the plurality of memory dies may include a TS situated in each region of the memory die. Each of the TSs may transmit information to each other of the plurality of memory dies, and each of the TSs may transmit information to thermal control logic (TCL). The number of TSs may be determined based on die size, thermal gradient, and required resolution for temperature sensing. If a higher resolution is required, more TSs may be used. If a lower resolution is sufficient, then fewer TSs may be used.

Temperature Control Logic (TCL) may be developed in firmware or hardware. TCL may read the state of the thermal sensors and can be used to adjust the refresh rates of each region based on the temperature of that region. The TCL may read a plurality of thermal sensors, at least two of the plurality of thermal sensors corresponding to different regions of memory cells. In order to support different device combinations, the TSs may be read by external logic via an external interface. Each type of memory or storage may be managed separately by separate TCL or other control logic.

In some embodiments, the TCL may indicate hot spots by transmitting thermal information to the host Operating System executing on the host processor 110 (FIG. 1). The TCL may further indicate hot spots to the mapping logic of the memory controller 120 such that the memory controller 120 may avoid mapping to the hot spots. The TCL may further receive thermal information from either or both the host processor 110 or the memory controller 120.

In a memory system 130 in which the logic layer is not tightly coupled to the memory dies, the TCL block may reside on one or more of the memory dies 210 or 220. In at least these embodiments, the memory controller 120 or other block may read the data from the TCL or the TCL may transmit the required changes to the processor 110. This transmission may be achieved using the standard protocol to read registers in the memory, with the use of interrupt signals, or special IO added to the memory system 130 to allow the transition of the required information such as a simple serial interface. The TCL may reside in any location, including separate logic or memory die of the memory system 130.

Operation of Thermal Control Logic

The TCL may continuously monitor the TSs or the TCL may sample the state of the TSs periodically. For example, the TCL may sample TS state every few micro-seconds (uS). Example embodiments may provide more than one, or multiple, TS sampling algorithms. For instance, when the memory system 130 is relatively cool, power may be saved by only sampling the temperature sensors periodically, for example, eight times per second. When a temperature sensor reports a hot rating the algorithm can be updated to sample that sensor more frequently. The sampling rate may be determined by how quickly the device(s) 130 can change temperature. Devices and systems that can change quickly over time will require faster sampling, devices or systems that change temperature slower can be sampled more slowly.

The TCL logic may track the state of each TS. The states can vary from design to design and system to system in different example embodiments.

Refresh

Example embodiments may control the refresh rate of memory cells based on temperature. In example embodiments, the entire memory system 130 is not treated the same with respect to control of refresh rates. On the contrary, each region may be refreshed individually based on the temperature of that region and not the worst-case temperature at any given location of the device.

Table 1 is an example of how the Temperature Gradient Categories may be used to control refresh:

TABLE 1

| Category | Refresh Rate |
| --- | --- |
| Cold | 1/8x |
| Cool | 1/4x |
| Room Temp | 1/2x |
| Warm | 1x |
| Hot1x | 1x |
| Hot2x | 2x |
| Hot3x | 4x |
| Hot4x | N/A - device damaged |

As can be seen in Table 1, the refresh rate may change for each channel or region of memory independently, based on the sample taken from the local temperature sensor. In the illustrative example of Table 1, Warm and Hot1× receive the same refresh rate, the rate specified in the device specification. When the samples show the device is in the Cold region the device or channel receives only ⅛ the normal refresh commands because the retention of the device is better when cold. When the sample from the TS identifies the temperature is in the Hot2× region the device, or channel will be refreshed twice as fast as specified. As temperature increases the DRAM may require more refresh cycles because the retention deteriorates with heat. Nevertheless, Table 1 is just an example, and the refresh rate variation may depend on the memory type and system implementation.

Figure 3:
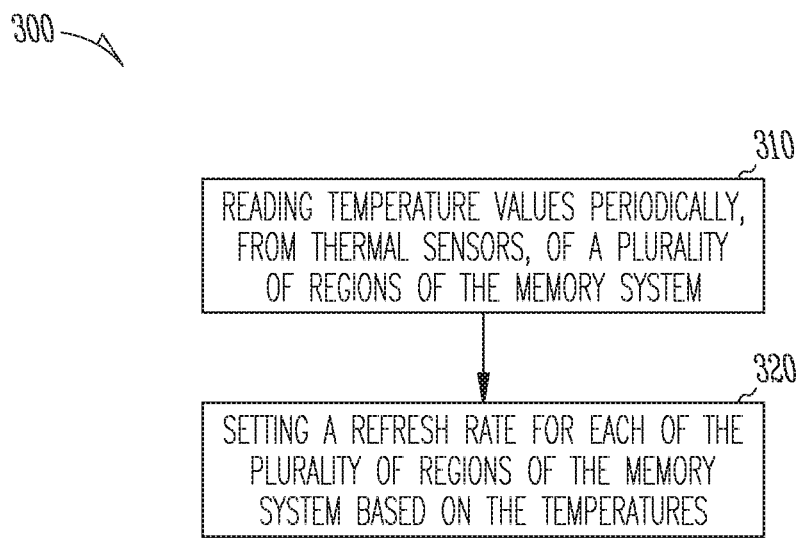
FIG. 3 is a flow diagram illustrating a method for setting refresh rates according to various embodiments.

FIG. 3 is a flow diagram illustrating a method 300 for setting refresh rates according to various embodiments.

In operation 310, Thermal Control Logic (TCL) (FIG. 2) may read temperature values periodically, from thermal sensors, of a plurality of regions of the memory system 130.

In operation 320, the Thermal Control Logic (TCL) may set a refresh rate for each of the plurality of regions of the memory system based on the temperatures. The TCL may adjust time intervals between readings based on the temperature values. The TCL may reduce the time intervals between readings upon a reading of a large change in temperatures and the TCL may increase the time intervals between readings if the temperatures remain unchanged over a number of readings. The TCL may transmit readings from a first memory region to a second memory region and from the second memory region to the first memory region. The TCL may help perform allocation and migration decisions based on the transmitted readings.

Thermal Adjusted Address Mapping

Example embodiments may provide methods to physically place data in memories to improve performance or power usage or to satisfy other system constraints. Mechanisms discussed with respect to example embodiments include address decoder-level (e.g., hardware) mapping changes as well as host operating system (e.g., software) memory allocation policies.

In example embodiments, 'static' thermal hot spots of a system may be characterized prior to the actual use of the system. Hot spots may be located around areas of high throughput compute, interface, or analog blocks that draw a lot of current. These hot spots may not always be "hot" depending on which application or function is being performed in the system but these are areas that are known to become hot based on the functionality the device is going to perform. These hot spots generally transfer heat to the adjacent die, in this example the other die is considered to be DRAM but could be any other memory or logic type.

Some software and firmware architects may prefer large regions of similar memory arranged in blocks such that they can then sub-divide the large region for particular applications without having holes or discontinuities in the memory map. Processors 110 supporting Virtual Memory may introduce a level of indirection between requested memory locations and their physical addresses. However, the target physical addresses may be re-mapped again into memory channel, rank, bank, row and column control signals without regard for thermal or other physically non-uniform regions. Memory controllers 120 typically scramble the logical to physical address mappings to achieve better performance or power characteristics. Example embodiments may add the thermal map knowledge to the mapping process.

In example embodiments hardware implemented in the memory controller 120 may utilize the pre-characterized and runtime (dynamic) thermal data to remap the physical locations such that the hot spots are in a known region of the map. In example embodiments, this known hot region may be the last memory to be assigned, thus if there is any available memory with a cooler temperature map those regions may be used first. When hot regions are mapped, according to example embodiments, the hot regions may be assigned the least frequently accessed logical addresses. Moreover, as runtime conditions change (software utilization and hardware), the monitoring and remapping facilities of example embodiments may migrate data accordingly, to different regions than the ones originally assigned.

The mapping solution of example embodiments may be performed in hardware or software. For a software solution, the operating system executing on a host processor 110 (FIG. 1) may maintain a list of free physical pages which can be selected to hold newly allocated data. An enhanced operating system may continuously update the free page list in order of lowest to highest temperature. The updates may be hardware-assisted, whereby the memory controller 120 or other hardware maintains the hot/cold free list in its own reserved storage area (e.g. SRAM, Flash, PCM or a reserved DRAM region), for example map RAM 140 (FIG. 1). The address map may be manipulated in a virtualized system via memory management systems, for example, memory management code that may make allocation decisions (and periodically, remapping decisions) based on real-time feedback on region temperature.

For a hardware solution, example embodiments may use an Intermediate Address Map (IAM). The IAM may provide another level of indirection between physical addresses entering the memory controller 120, and the main memory (e.g. DRAM) addresses actually used.

Some memory systems, for example hybrid stacked memories, may have hot components in the stacked controller die (e.g. I/O interfaces or channel controllers). Because of the hot components, applying dynamic address mapping according to example embodiments may balance transactions across all physical I/O links at runtime, removing hotspots.

Figure 4:
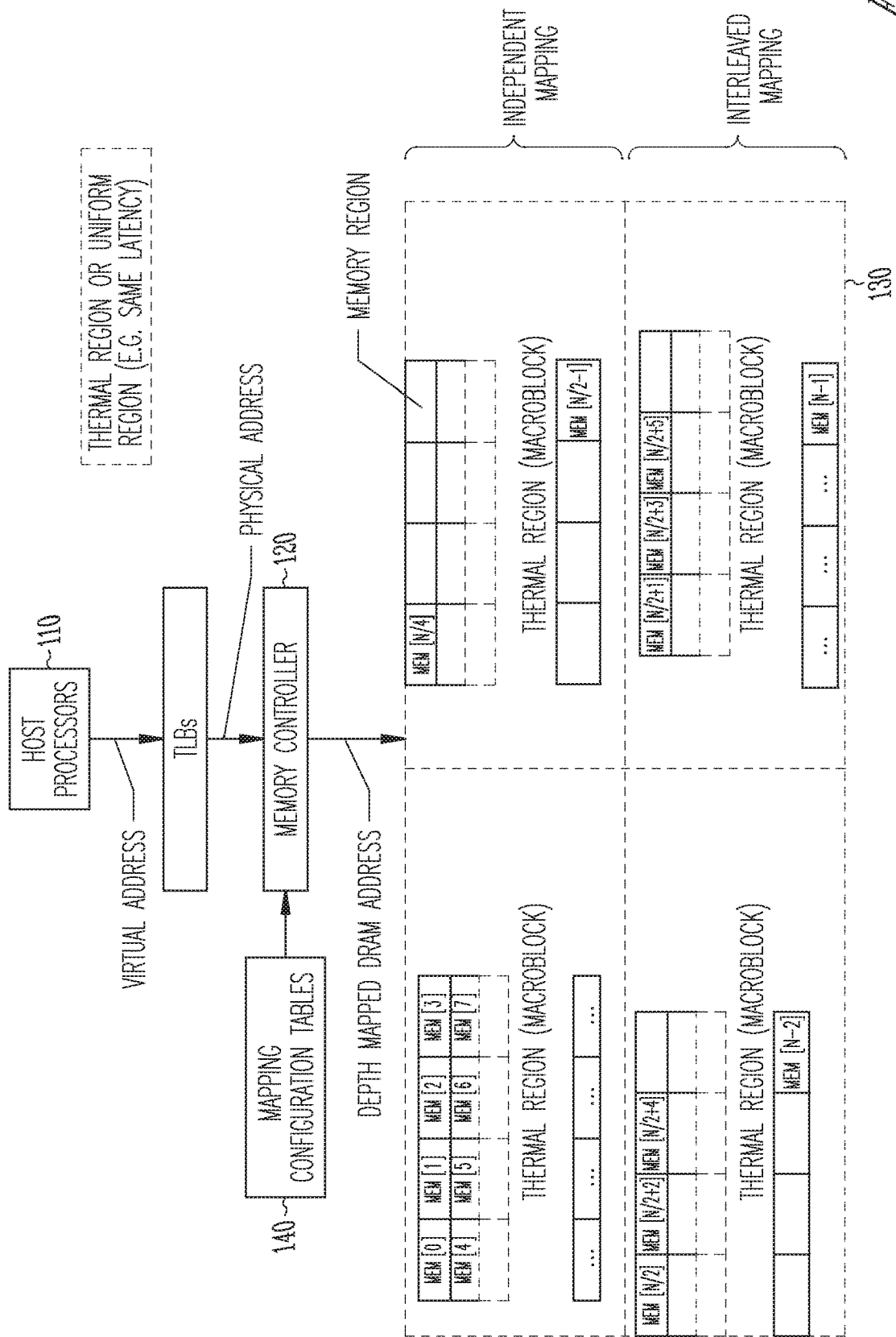
FIG. 4 is a diagram of the logical system structure according to various embodiments.

FIG. 4 is a diagram of a physical dynamic random access memory (DRAM) floor plan according to various embodiments. FIG. 4 illustrates how the physical address space may be subdivided into large 'uniform regions' relating to the physical placement of the uniform regions. This address translation may occur within a memory controller 120 (FIG. 1) enhanced with static and runtime thermal information. The same techniques may be used for mapping between non-uniform memory regions such as those with different latencies and bandwidths. In some systems according to example embodiments, memory die may include banks of addresses operating with different latencies, so thermal information according to example embodiments could indicated to the host processor 110 as permanently 'cold' regions for allocating the most heavily used data.

As shown in FIG. 4, a host processor 110 may provide virtual addresses to a translation lookaside buffer (TLB). The TLB may store a mapping between a virtual address, which is the address of a process executing on the host processor 110, and the physical addresses, which are natural physical locations in the memory system. Each time a process of the host processor 110 accesses memory in the memory system 130, the host processor 110 provides a virtual address, which is translated by the TLB to a physical address. The physical address may be provided by the TLB to the memory controller 120 and the memory controller 120 may do a further level of remapping to map the physical address to the structure inside the memory system 130, for example to memory system rows, columns, banks, channels, etc.

FIG. 4 depicts two mapping schemes that may be implemented by the memory controller 120 when the memory controller 120 maps the physical address from the TLB to locations in the memory system 130. In the illustrative example shown in FIG. 4, coarse-grained physical region mapping for single-rank and double-rank regional Depth Mapping modes may be implemented in accordance with some embodiments.

In the first mapping scheme, implemented in the top row of thermal regions of the memory system 130, memory locations are mapped to be physically adjacent to each other in the memory. A first set of addresses is mapped in region Mem[0], then the next set of physical addresses is mapped to region Mem[1] and so forth down to Mem[N/4−1]. After the region Mem[N/4−1] has been used, according to the first mapping scheme, the region Mem[N/4] in the adjacent thermal region is mapped to the next set of physical addresses.

In the second memory mapping scheme, implemented in the bottom row of thermal regions of the memory system 130, physical addresses are mapped first to the region Mem[N/2], then to the memory region Mem[N/2+1], then back to Mem [N/2+2], and subsequently into alternate mappings between memory regions in the left thermal region and memory regions of the right thermal region. While the second memory mapping scheme may have performance benefits, data migration may become more difficult so the necessity data migration will preferably be minimized in example embodiments.

The necessity for data migration may be minimized if the two thermal regions have similar temperatures, areas, and thermal capacitance, as will be discussed below with respect to FIG. 6-9.

The memory controller 120 may implement both the first and the second mapping scheme together, or the memory controller 120 may implement one or the other of the first mapping scheme and the second mapping scheme.

Transaction Throttling Mechanisms

In some embodiments, the processor 110 or the memory controller 120 may use a memory request throttling mechanism to shape memory activity and to remove thermal hotspots temporarily while the memory controller 120 performs data re-mapping. These and other embodiments may reduce or eliminate the occurrence of memory failure or degradation when sudden thermal events do not leave sufficient time for a data migration, or when thermal events are too short for implementation of data migration and re-mapping. In some embodiments, the memory controller 120 may turn off (e.g., disable) data accesses to certain channels, banks or regions of the memory. The memory controller 120 protocol for a memory system 130, which may include the on-die or off-die memory controller 120, may include a priority level. The priority level may support a level of indirection, whereby an identifier associated with a memory request initiates a table lookup (see Table 2). The table may be programmable by special commands. The lookup may indicate minimum and maximum bandwidth limits, along with maximum latency values. Separate limits may be specified for reads and writes, and there may be a set of hard limits and soft ('preferred') limits. The hard limits may be used to support performance-critical or real-time workloads.

TABLE 2

Priority characteristics table. This table may be programmable and may be used by the host system(s) to indicate mandatory and desired characteristics of transaction streams as indicated by a per-transaction "Priority ID" field.

| | READ | | | | | | WRITE | | | | | |
|---|---|---|---|---|---|---|---|---|---|---|---|---|
| | Hard Limit | | | Soft Limit | | | Hard Limit | | | Soft Limit | | |
| Priority ID | Min BW | Max BW | Max Lat | Min BW | Max BW | Max Lat | Min BW | Max BW | Max Lat | Min BW | Max BW | Max Lat |
| 0 | | | | | | | | | | | | |
| 1 | | | | | | | | | | | | |
| ... | | | | | | | | | | | | | may migrate data from those memory cells to other memory cells to remove the need to refresh those memory cells and to minimize or reduce power consumption in the region including those memory cells.

In some example embodiments, the memory controller 120 may perform transaction throttling. In some current systems, request prioritization may allow more memory transaction requests from different sources. Transaction throttling in some embodiments may allow memory and logic thermal hotspots to be controlled or moved by reducing switching activity in the logic or memory being targeted. For example, in some embodiments, requests may be reduced to a hot area of a 3D-stacked memory controller and DRAM die such as the Micron HMC. As a further example, the activity of a hot core may be indirectly throttled in a 3D-stacked compute and DRAM die by limiting its request bandwidth. This indirect throttling may reduce the temperature of memory components directly above the core, allowing the components to be refreshed less frequently. In some embodiments, the memory addresses being throttled may be in entirely different physical locations in the DRAM die.

Throttling may be performed at different granularities within the memory device. In order of increasing complexity, throttling may be done at the channel or vault level, the rank level, the bank level, the sub-bank level, or the row or column level in a memory device.

In some embodiments, the memory controller 120 may perform throttling. In some embodiments, throttling may be performed outside the memory controller 120 when an appropriate command protocol is present (which allows the target memory 130 (FIG. 1) to assert back-pressure or deny requests). Using JEDEC-like protocols, the target memory 130 may implement throttling using the error-detection mechanism. When the memory 130 wants to ignore requests, the memory 130 may a fake memory error (e.g. CRC or ECC error). The host processor 110 may then re-try the request at a later time.

Current die-stacked memory systems with a command interface do not currently support advanced request priority features. In some example embodiments, the command External messages or signals may be provided to the host processor 110 when these limits are violated, and the current status of runtime bandwidth and latency, per Priority ID, may be queried at any time. The mechanisms by which memory controllers 120 enforce the transaction priority characteristics may include, but are not restricted to: per-priority mode counters that monitor request bandwidth and latency; periodic, incremental adjustment of knobs to approach the target limits, where the knobs may include the number of memory controller buffer entries allocated to each Priority ID or counters in the command arbiter and selection units to change relative priorities; ignoring Priority ID groups well within their limits while adjusting knobs of Priority ID groups that are close to their limits; and runtime adjustment of memory controller 120 settings using a host processor 110 thread, a dedicated microcontroller, or custom logic.

In an example embodiment of transaction throttling using an existing bus interface standard, in addition to the memory device 130 throttling the memory traffic accesses to 'hot' regions, the memory controller 120 may further throttle the number of transactions that issue to the 'hot' region by limiting or slowing the accesses to the region.

Transaction throttling may also be used with versions of the ARM Advanced Extensible Interface (AXI) bus virtualization protocol. The virtualization protocol may give each processor 110 or set of processors 110 its own network ID. Accordingly, several processors 110 in a system 100 may share the same physical bus or buses and queues but the processors 110 may continue to have different arbitration results and slave-way responses based on the virtual network to which the processor 110 belongs. In some embodiments, when a processor 110 is on a virtual network and the processor 110 targeting a hot memory region, the memory controller 120 may reduce the queue entries associated with that network to reduce the request rate without having to use software intervention or adding sideband signals back to the processor 110. In this manner, the memory controller 120 may shape the traffic targeting only the hot spot(s) without affecting traffic that targets cooler or cold regions leaving those regions to operate at their pre-determined operating points.

Figure 5:
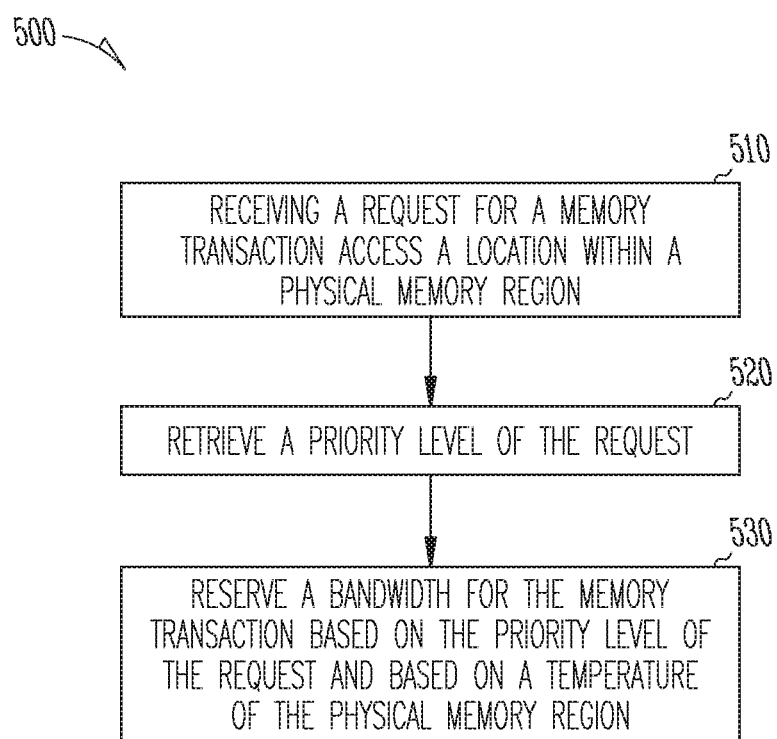
FIG. 5 is a flow diagram illustrating a method of memory throttling according to various embodiments.

FIG. 5 is a flow diagram of a method 500 for throttling memory transactions in accordance with at least one embodiment.

In operation 510, a memory controller 120 (FIG. 1), may receive a request for a memory transaction accessing a location within a physical memory region. The request may be received from, for example, a host processor 110 (FIG. 1).

In operation 520, the memory controller 120 may retrieve a priority level of the request. The memory controller 120 may retrieve the priority level from a table similar to the Table 2 discussed previously. As discussed above, the table may be programmable by special commands, and the table may indicate minimum and maximum bandwidth limits, along with maximum latency values. Separate limits may be specified for reads and writes, and there may be a set of hard limits and soft ('preferred') limits. The hard limits may be used to support performance-critical or real-time workloads.

In operation 530, the memory controller 120 may reserve a bandwidth for the memory transaction based on the priority level of the request and based on a temperature of the physical memory region.

The method 500 may further include determining that the physical memory region is in a first temperature state, inhibiting the request from accessing the location based on the determining, and transmitting an error message to a host processor 110 to notify of the inhibiting. Throttling, as discussed above, may be implemented using current bus interface standards such as the ARM AXI bus virtualization protocol.

In some embodiments, a host processor 110 may obtain the thermal physical characteristics of an external (3D stacked or otherwise) device, for example the memory system 130 (FIG. 1). The host processor 110 may obtain the thermal information from the memory controller 120 or map RAM 140 of the memory controller. Thermal information may include a graph, for example a data structure, of material regions along with the regions' location in space, and the regions' thermal capacitance and resistance (RC) properties. The thermal information may also be specified at a higher level, for example by a separate software application for collecting and dispensing thermal information. For example the static thermal properties of the devices may be loaded from software rather than a hardware table.

In some embodiments, a memory controller 120 may protect thermal information via encryption or through the need for a privileged memory request, through a read from a reserved region of addresses, or through reads via a separate data channel (e.g. a simple serial interface).

In some embodiments, the host processor 110 may use thermal information communicated by the memory controller 120 to the host processor 110 to allocate (and re-allocate as temperature changes) memory pages in a priority order. The host processor 110 may implement a priority order according to one of at least two alternatives. In a first alternative, the most frequently-accessed pages may be allocated to the coolest regions. In at least these embodiments, heat may be spread out from I/O, sense-amp and other access logic into areas with more thermal headroom.

In a second alternative, the most frequently-accessed pages may be allocated to the hottest regions. A host processor 110 may implement this alternative because the hot regions in some volatile memories such as DRAM may require more frequent refresh operations than cold regions. By pushing memory activity to those regions, fewer explicit refresh commands need to be sent to those regions, as page open and close activity serves as a refresh.

Some embodiments may implement an additional "upload" mechanism whereby information such as thermal limits (for a remote memory controller 120), thermal properties or dynamic temperature measurements of a host processor 110 die (or any other nearby die) can be sent by the host processor 110 to the units, dies, or regions of the memory system 130. For example, the host processor 110 may store the settings or measurements may be stored in a memory of the host processor 110 and the host processor 110 may send the settings or measurements to the memory controller 120. The memory controller 120 may use this information to direct transaction throttling or data movement operations. In addition to data being sent, micro-code or other executable instructions for implementing thermal control policies, throttling policies or other memory controller 120 behaviors can be sent to the memory system 130.

In some embodiments, the host processor 110, the memory controller 120, and the memory system 130 may share thermal data during a power up or during periodic sharing. In at least these embodiments, nearby dies may communicate their static thermal properties and dynamic thermal sensor data to each other. This sharing may support data and thread placement (allocation) and migration (movement) decisions. The sharing may occur between any types of component in the system 100, not merely between compute and memory dies.

In some embodiments, the memory controller 120 may provide hardware support for operating system page allocation and migration mechanisms. In at least these embodiments, an in-memory copy command may be provided by the memory controller 120 to perform internal transfers of thermal information that without using external bus resources. A map RAM 140 (SRAM/DRAM etc.), may be controlled by the memory controller 120 may provide a 'free list' of the coolest page addresses that should be allocated next. The map RAM 140 may alternatively or additionally be controlled by, for example, thermal control logic (TCL), the host processor 110, or a software application.

The map RAM 140 may be addressable by the host processor or host processors 110 (via appropriate mutual exclusion or lock mechanisms). To avoid providing already-allocated free list entries to the host processor 110, the memory controller 120 may have access to the host page table structures maintained by the host processor 110. The memory controller 120 may query the host page table structures to see if the host processor 110 has mapped a page.

Example embodiments may further provide a "memory interrupt" signal or message that allows the memory system 130 or an external memory controller 120 to notify the host processor 110 or thermally-connected devices of thermal events. For example, if a memory region has too many errors, has too high a refresh frequency or has become a thermal hotspot, nearby devices or a controlling host processor 110 can be notified to take evasive action (re-mapping data, throttling frequency/voltage, migrating code to other cores etc.).

Device Property Query, Mapping and Migration Support Mechanisms

Example embodiments may include mechanisms for control logic to query memory devices on their temperature, to set thermal limits on memory devices, to communicate thermal maps and notification of status and thermal emergencies to connected control or processing logic. Memory devices, for example the memory system 130, may communicate their physical thermal properties to an external processing unit, for example the memory controller 120 or the host processor 110. In this manner, thermal management mechanisms already implemented on the processor 110 can build a thermal model for temperature prediction, independent of the type of memory device actually connected to it. Similarly, the memory device can provide other static information indicating the energy and power implications of certain controller actions to the processor 110 or the memory controller 120. The static information may include a table of absolute or relative energy, power or power density, as a function of request bandwidth, size, page hit rate or other measurable traffic features.

Figure 6:
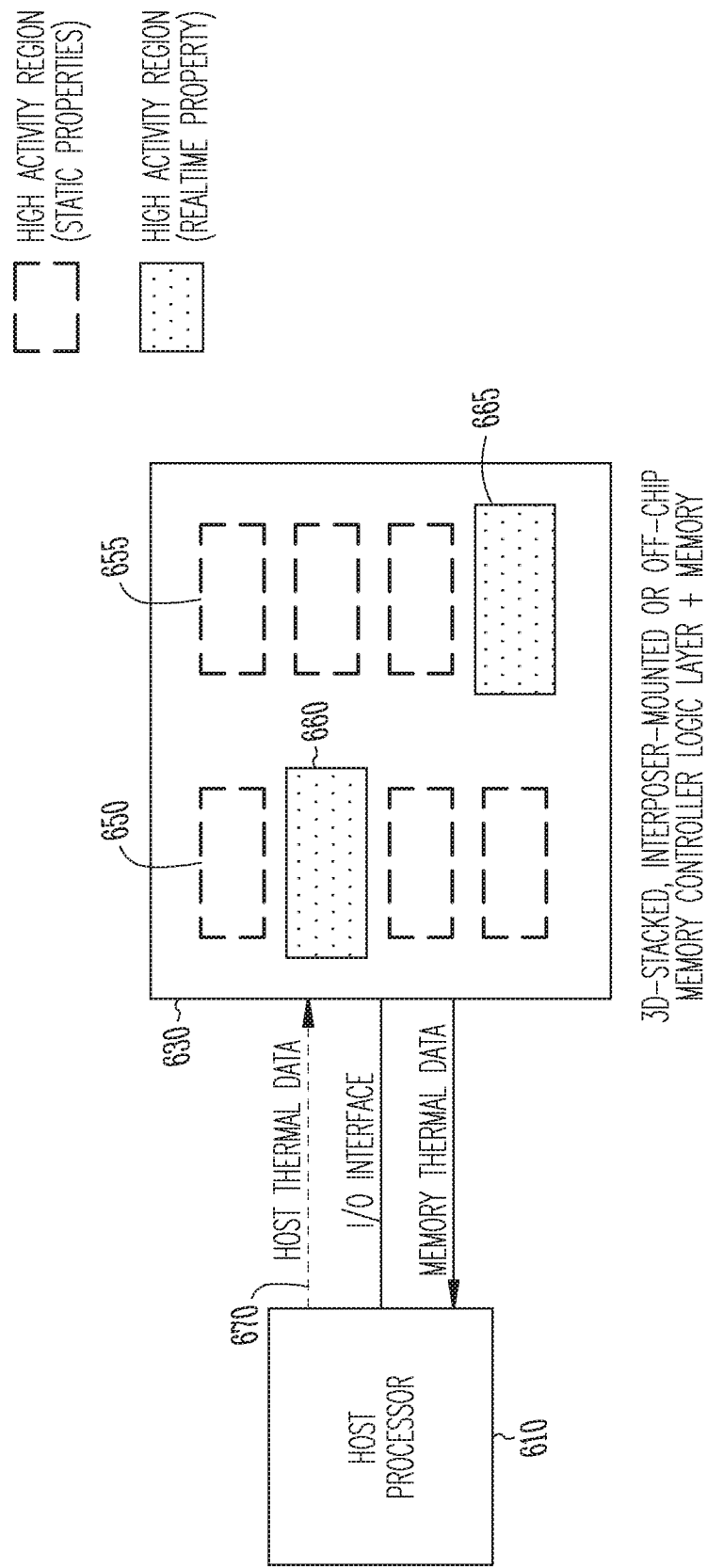
FIG. 6 is an example of static and dynamic thermal information sharing according to various embodiments.

FIG. 6 illustrates cooperate host memory data activity mapping in accordance with some embodiments. In FIG. 6, the host processor 610 may be operative to serve the functions of the host processor 110 (FIG. 1). The memory system 630 may serve the functions of the memory system 130 (FIG. 1). The memory system 630 may include 3D-stacked memory dies but example embodiments are not limited thereto. The memory system 630 may include a controller logic layer for example a logic die. The logic die may be stacked directly under the memory chips. All or some of the memory controller 120 logic may be implemented in the logic die. Regions such as regions 650 and 655 may be statically-defined hot regions or regions that are expected to get hot. Regions 660 and 665 are regions measured as hot in real-time by temperature sensors (FIG. 2). The thermal information for the regions may be stored in the map RAM 140 (FIG. 1). The bidirectional arrow 670 shows that the host processor 610 can both read temperature information from the memory system 630 and provide host processor 610 temperature information to the memory system 630.

During run time, the host processor 610 may create hot spots and the host processor 610 may communicate this information to other thermally-connected devices. The memory system 630 may likewise inform the host processor 610 of thermal conditions, including the static map stored in the map RAM 140 (FIG. 1) and dynamic thermal information measured by temperature sensors (FIG. 2).

Figure 7A:
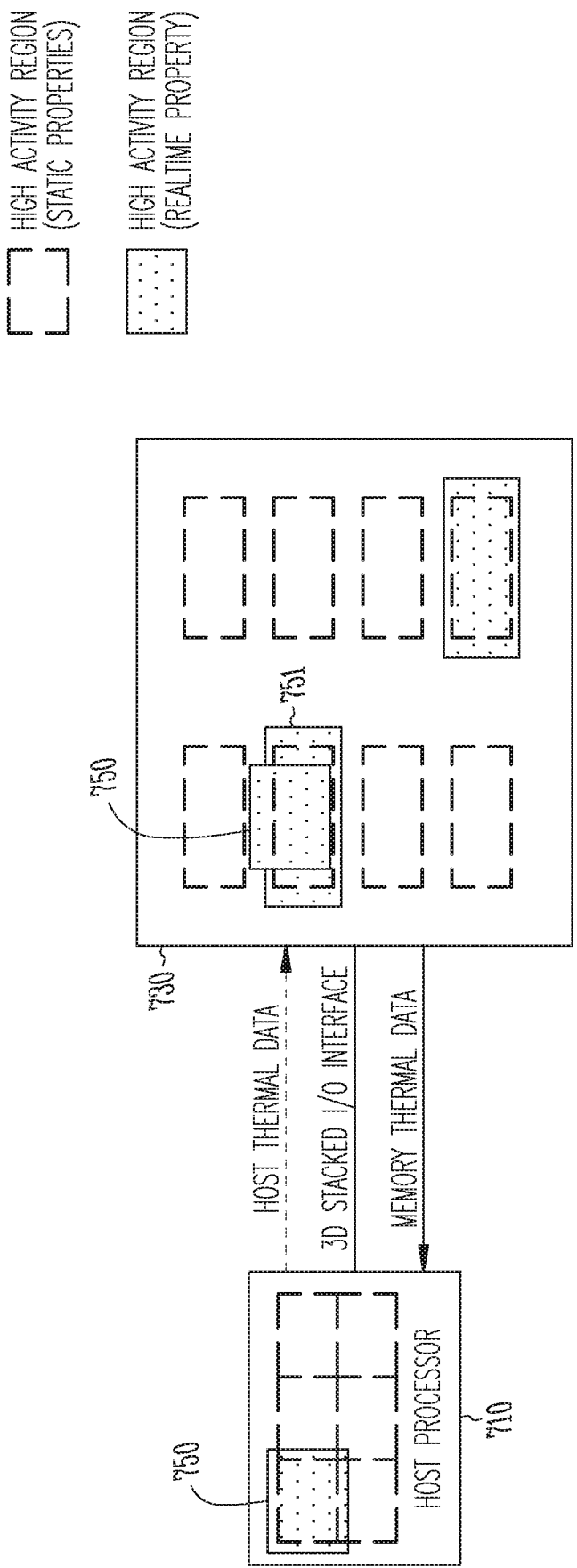
FIGS. 7A-7B are examples of cooperative host memory data activity mapping according to various embodiments.
Figure 7B:
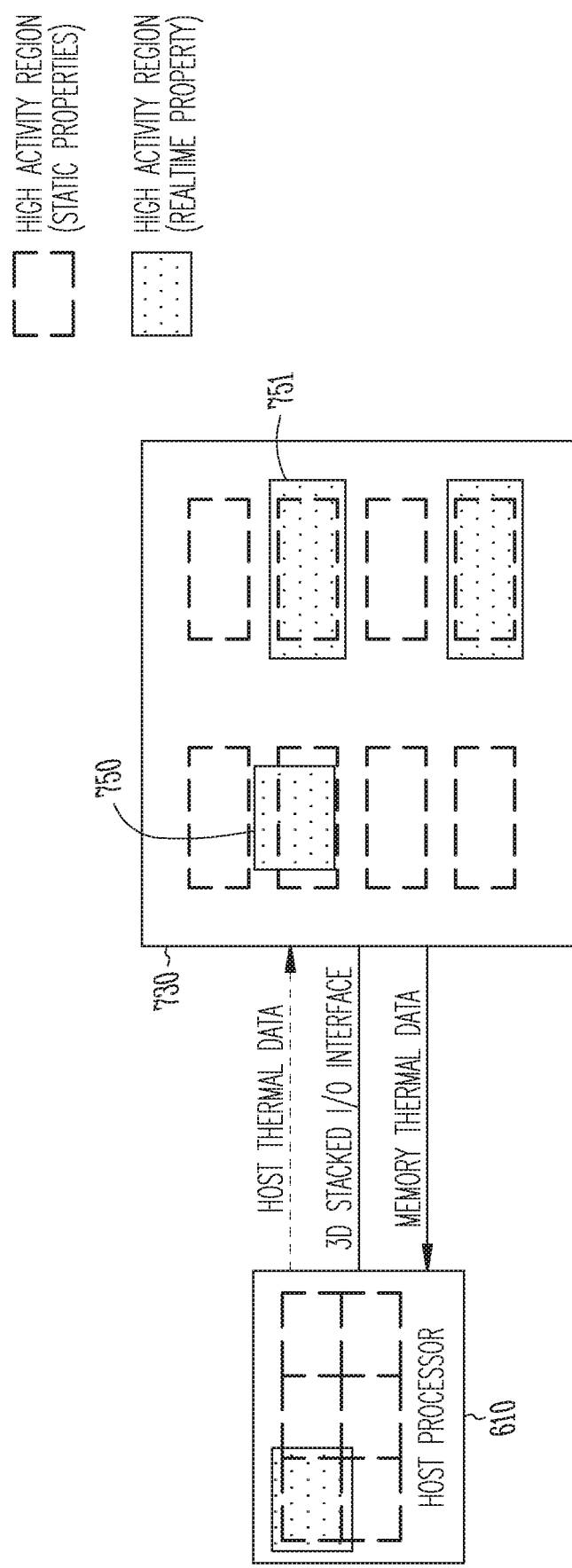

FIG. 7A depicts a similar system to FIG. 6, in which the host processor 710 has produced a hot spot 750 that overlaps a hot spot 751 in the memory system 730. Accordingly, in FIG. 7B, the host processor 710 or the memory controller 120 (FIG. 1) may move the hot spot 751 so that the hot spot 751 no longer overlaps with hot spot 750. The host process 710 or the memory controller 120 may copy data from its original location and update the map RAM 140 (FIG. 1) to reflect the new mapped region of hot spot 751.

Figure 8:
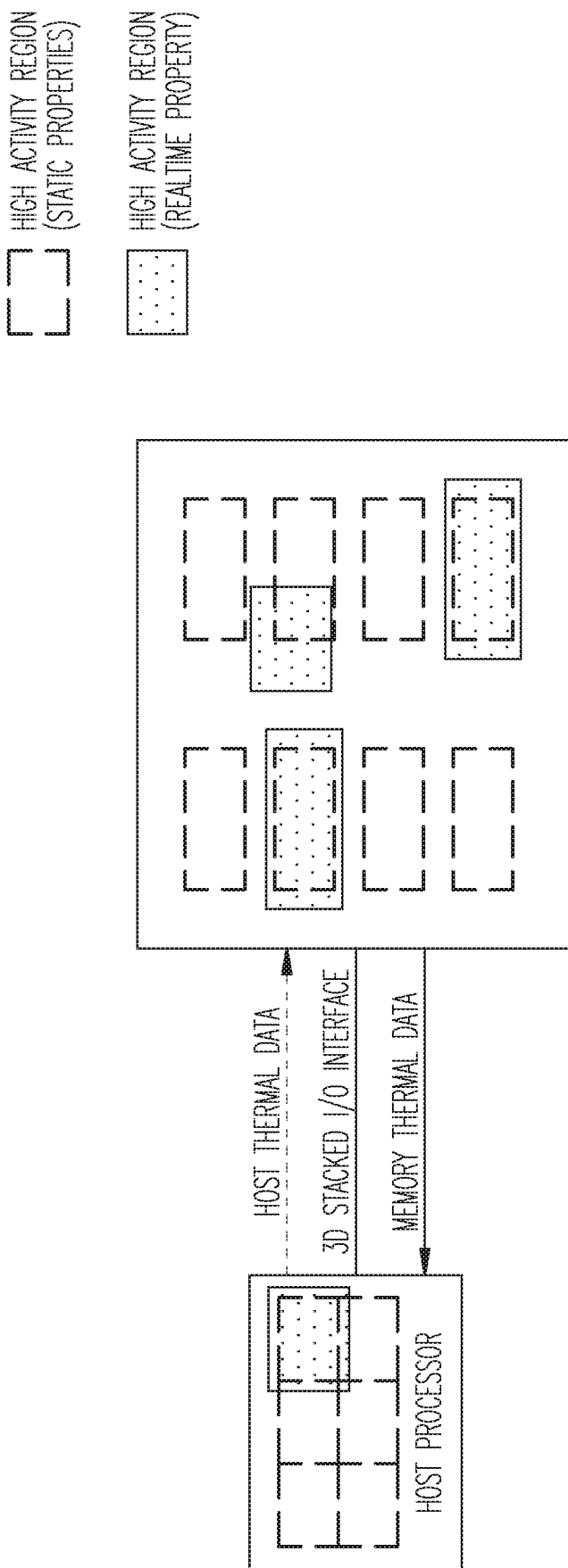
FIG. 8 is an example of cooperative host memory data activity mapping according to various embodiments.

FIG. 8 depicts a similar system as that described above with respect to FIG. 6-7. In FIG. 8, the host processor 110 may migrate code, rather than data as discussed above with respect to FIG. 7, to another host processor 110 (for multi-processor systems).

Figure 9A:
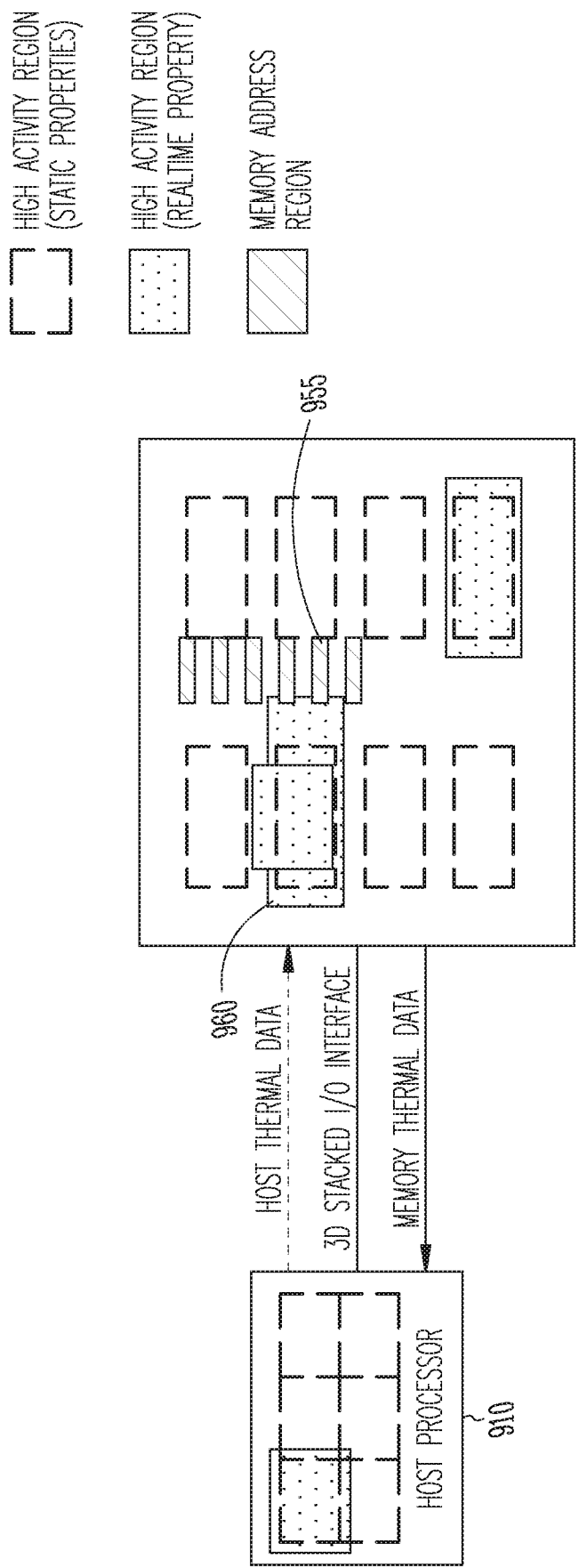

FIG. 9 depicts a similar system as described above with respect to FIG. 6-8. In FIG. 9, memory address regions 955 are migrated to be away from the hot spot 960.

Figure 10:
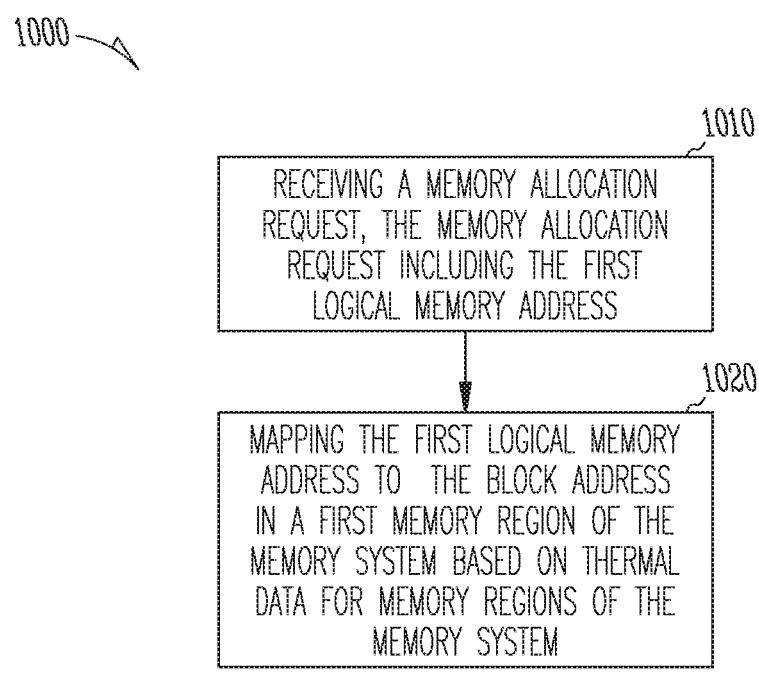
FIG. 10 is a flow diagram illustrating a method for mapping memory according to various embodiments.

FIG. 10 is a flow diagram illustrating a method 1000 for mapping memory in accordance with some embodiments.

In operation 1010, a memory controller 120 (FIG. 1) may receive a memory allocation request from a host processor 110. The memory allocation request may include a first logical memory address.

In operation 1020, the memory controller 120 may map the first logical memory address to the block address in a first memory region of the memory system based on thermal data for memory regions of the memory system. The first memory region may have a lowest temperature of the memory regions of the memory system 130. The thermal data may be received from thermal sensors discussed above with respect to FIG. 2. The method 1000 may further include mapping a second logical memory address to a second memory region. The second memory region may have a higher temperature than the first memory region.

The method 1000 may further include storing the thermal data in a table in, for example, the map RAM 140 (FIG. 1). The method 1000 may further include storing a default value for thermal data for each of the memory regions in the memory system 130. The default value may be based on a characteristic of each of the memory regions. The method 1000 may further include updating thermal data in the table in the map RAM 140 based on a sensed temperature during operation of the memory regions. The method may further include remapping the first logical memory address to a block address in a second memory region based on the updated thermal data. The remapping may comprise copying data from the first memory region to the second memory region as discussed above with respect to FIG. 6.

The method 1000 may further include mapping physical data corresponding to the first logical memory address across two or more memory regions of the memory system and accessing physical data in each of the two or more memory regions. As discussed above with respect to FIG. 4, the memory controller 120 may interleave addresses across regions, as shown in the second mapping scheme discussed above with respect to FIG. 4. However, the interleaving of the lower two regions may make it more costly to migrate data to other regions if either of the two regions become hot. Interleaving of the type shown in the lower two regions of FIG. 4 may safely be performed if the static thermal map indicates that both regions are likely to be of equal temperature.

Figure 11:
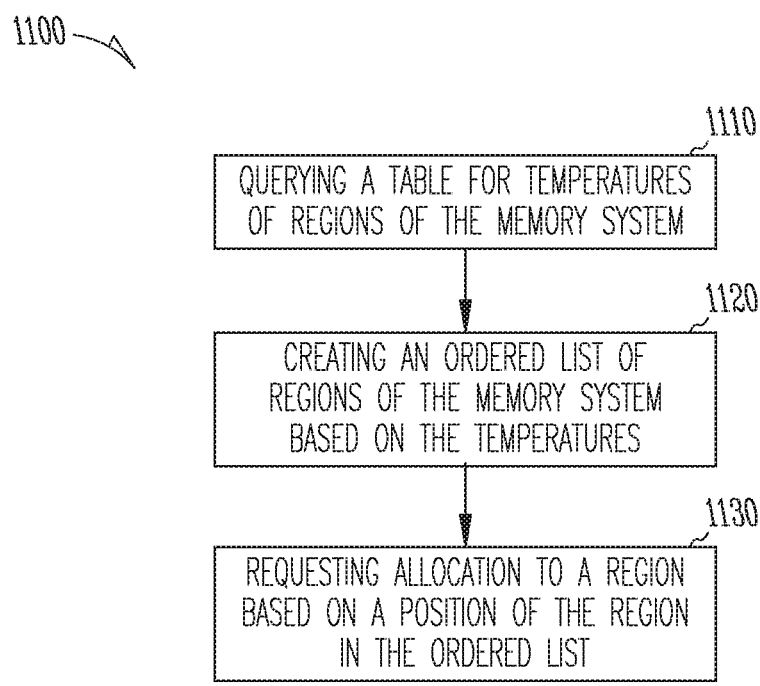
FIG. 11 is a flow diagram illustrating a method for allocating memory according to various embodiments.

FIG. 11 is a flow diagram illustrating a method 1100 for allocating memory according to various embodiments.

In operation 1110, the host processor 110 (FIG. 1) may query a table for temperatures of regions of the memory system 130. In an example, the table may be stored in the map RAM 140 as discussed above with respect to FIG. 1-2.

In operation 1120, the host processor 110 may create an ordered list of regions of the memory system based on the temperatures of the regions retrieved form the table in, for example, the map RAM 140. The ordered list may further be ordered based on a physical location of the regions of the memory system 130.

In operation 1130, the host processor 110 may request allocation to a region based on a position of the region in the ordered list. For example, the host processor 110 may first allocate to the coldest region on the list. The request may further be based on a characteristic of the process. For example, some processes may require a certain amount of bandwidth or specific energy requirements for process data. As another illustrative example, some processes may be allocated to a hotter region if refresh operations are expected to occur more frequently for that process.

The operation 1100 may further include receiving an indication that the temperatures of the region have changed. For example, the processor 110 or memory controller 120 may receive indications on temperatures as discussed above with respect to FIG. 6-9. The processor 110 may reorder the ordered list based on the updated temperatures. The processor 110 may remap a logical address corresponding to the allocation from a first memory region to a second memory region based on receiving updated temperature information. The remapping including copying data from the first memory region to the second memory region. The processor 110 may perform remapping of code or data, as discussed above with respect to FIG. 6-9.

The apparatus of various embodiments includes or can be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multi-layer, multi-chip modules. Such apparatus may further be included as sub-components within a variety of electronic systems, such as televisions, memory cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Some embodiments may include a machine-readable medium on which is stored one or more sets of instructions (e.g., software) embodying any one or more of the methodologies or functions described herein. The instructions may reside, completely or at least partially, within the processor 110 or the memory controller 120 (FIG. 1) during execution thereof by the system 100, with the processor 110 and the memory controller 120 also constituting machine-readable media.

For example, the machine-readable medium, when executed on the processor 110, may cause the processor 110 to maintain a list of available regions of a memory system 130. The list may be in an order based on temperatures of the available regions. The temperatures may be default temperatures based on a predicted temperature of the corresponding available region. The predicted temperature may be based on a physical characteristic of the corresponding available region.

The computer-readable medium may further cause the processor 110 to request an allocation, to a process executing on the processor 110, of a first block address in a first available region in the list based on the order of the first available region in the list and further based on a characteristic of the process. The machine-readable medium may cause the processor 110 to receive update temperature data from, for example, the map RAM 140 (FIG. 1) from the memory controller 130, or from temperature sensors in the memory system 130. The machine-readable medium may cause the processor 110 to reorder the list based on the updated temperature data and allocate a second process to be mapped to a second block address in a second available region of the memory system 130 based on the reordered list.

Example embodiments described herein may provide control of memory refresh rates in the presence of activity hotspots. Example embodiments may provide increased thermal headroom for performance-boosting techniques where clock frequency is boosted when most compute units are idle by moving data away from the hot core or by throttling its memory bandwidth. In contrast to some existing systems, memory bandwidth throttling and data re-mapping from hot memory regions described with respect to example embodiments may be entirely under the control of the memory logic. Accordingly, example embodiments may permit the memory vendor to use proprietary sensors embedded in memory to avoid thermal hazards. Example embodiments may use a memory controller stack layer of a hybrid memory cube (HMC) or other memory that is not stacked with the host processing device, to provide thermal control.

The machine-readable medium may be a single medium or may be multiple media (e.g., a centralized or distributed database, and/or associated caches and servers) that store the one or more sets of instructions. "Machine-readable medium" may include any non-transitory medium that is capable of storing, encoding, or carrying a set of instructions of execution by the machine. By way of example and not limitation, "machine-readable medium" may include solid-state memories, optical media, or magnetic media.

The above description and the drawings illustrate embodiments to enable those skilled in the art to practice the embodiments. Other embodiments may incorporate structural, logical, electrical, process, and other changes. In the drawings, like features or like numerals describe substantially similar features throughout the several views. Portions and features of some embodiments may be included in, or substituted for, those of others. Many other embodiments will be apparent to those of skill in the art upon reading and understanding the above description.

The Abstract of the Disclosure is provided to comply with 37 C.F.R. § 1.72(b), requiring an abstract that allows the reader to quickly ascertain the nature of the technical disclosure. The Abstract is submitted with the understanding that it will not be used to interpret or limit the claims.

What is claimed is:

1. A system comprising:
   a stacked memory structure operable to communicate with a host, the stacked memory structure having multiple memory dies arranged vertically in a stack, one or more of the multiple memory die arranged into multiple regions, such regions having a respective thermal sensor; and
   thermal control logic operable to read the state of the thermal sensors and to adjust refresh rates of the multiple regions of the one or more memory die based on the temperature of the respective region, wherein the thermal control logic is operable to adjust refresh rates of multiple regions of each memory die independently, using a relationship between temperature gradient categories and refresh rates to control refresh, the relationship correlated to a product of a factor and a reference refresh rate.

2. The system of claim 1, wherein the stacked memory structure is further stacked with a logic die, the logic die having memory controller logic to execute memory transaction requests from the host and transfer data between the host and the stacked memory structure.

3. The system of claim 2, wherein the logic die includes a thermal sensor disposed on the logic die.

4. The system of claim 2, wherein the thermal control logic is disposed in the logic die.

5. The system of claim 1, wherein the thermal control logic is disposed in one or more of the memory dies of the stacked memory structure.

6. The system of claim 1, wherein the total number of thermal sensors disposed on a memory die of the stacked memory structure is equal to or greater than a number of the multiple regions.

7. The system of claim 1, wherein the thermal control logic is operable to transmit thermal information to the host to indicate hot spots and/or to transmit thermal information to a memory controller for the stacked memory structure to indicate hot spots for mapping logic of the memory controller.

8. The system of claim 7, wherein the thermal control logic is operable to receive thermal information from the host and/or the memory controller.

9. A system comprising:
a stacked memory structure having multiple memory dies arranged vertically in a stack, each memory die arranged into multiple regions with each region of each memory die having a thermal sensor on the region of the respective memory die;
a logic die arranged to communicate with stacked memory structure such that the stacked memory structure is arranged to operably communicate with a host through the logic die, the logic die having memory controller logic to execute memory transaction requests from the host and transfer data between the host and the stacked memory structure, wherein the memory control logic is operable to reserve a bandwidth for a memory transaction, from a host request to access a location within the stacked memory structure, based on a priority level of the host request and based on a temperature of a region corresponding to the access; and
thermal control logic operable to read the state of the thermal sensors, and to adjust refresh rates of each region of each memory die based on the temperature of the respective region, and operable to provide thermal data for communication to a host.

10. The system of claim 9, wherein the thermal control logic is disposed in the logic die.

11. The system of claim 9, wherein the logic die is disposed in the stack.

12. The system of claim 11, wherein the memory control logic is operable to map a logical memory address to a block address in a region of a memory die based on the thermal data for regions of the stacked memory structure.

13. The system of claim 12, wherein the memory control logic is operable to remap the logical memory address to another block address in another region of the stacked memory structure, based on updated thermal data.

14. The system of claim 11, wherein the memory control logic is operable to map first physical data corresponding to a logical memory address across two or more regions of the stacked memory structure and to access second physical data in each of the two or more memory regions.

15. The system of claim 11, wherein the memory control logic is operable to map logical memory addresses to physical addresses of the stacked memory structure by mapping to physical addresses interleaved across the regions of the stacked memory structure.

16. The system of claim 11, wherein the memory control logic is operable to control memory bandwidth throttling and data re-mapping from regions of the stacked memory structure identified as hot memory regions, based on the thermal data.

17. The system of claim 11, wherein the system includes a random access memory separate from the stacked memory structure and accessible by the logic die, the random access memory arranged to store the thermal data.

18. The system of claim 11, wherein the host includes a host processor die disposed nearby the stack.

* * * * *